(12) United States Patent
Bjerke et al.

(10) Patent No.: US 7,702,986 B2
(45) Date of Patent: Apr. 20, 2010

(54) RATE-COMPATIBLE LDPC CODES

(75) Inventors: Bjorn A. Bjerke, Boston, MA (US);
John W. Ketchum, Harvard, MA (US);
Nagabhushana Sindhushayana, San Diego, CA (US); Jay Rod Walton, Carlisle, MA (US)

(73) Assignee: Qualcomm Incorporated, San Diego, CA (US)

( * ) Notice: Subject to any disclaimer, the term of this patent is extended or adjusted under 35 U.S.C. 154(b) by 58 days.

(21) Appl. No.: 10/299,374

(22) Filed: Nov. 18, 2002

(65) Prior Publication Data

US 2004/0098659 A1 May 20, 2004

(51) Int. Cl.
*H03M 13/00* (2006.01)

(52) U.S. Cl. ............... 714/755; 714/786; 714/800; 714/801; 714/781; 341/143

(58) Field of Classification Search ......... 714/800–801, 714/755, 786, 781; 375/395.02, 26; 341/143
See application file for complete search history.

(56) References Cited

U.S. PATENT DOCUMENTS

| 4,295,218 | A |   | 10/1981 | Tanner |                |
|-----------|---|---|---------|--------|----------------|
| 5,563,912 | A | * | 10/1996 | Yasunaga et al. | ........... 375/242 |
| 5,699,365 | A |   | 12/1997 | Klayman et al. |         |
| 5,815,514 | A | * | 9/1998  | Gray   | ........... 714/775 |
| 5,889,794 | A | * | 3/1999  | Mo et al. | ........... 714/784 |
| 5,912,752 | A | * | 6/1999  | Mollett et al. | ........... 398/118 |
| 5,920,552 | A | * | 7/1999  | Allpress et al. | ........... 370/335 |
| 6,000,053 | A | * | 12/1999 | Levine et al. | ........... 714/766 |
| 6,397,367 | B1 | * | 5/2002 | Park et al. | ........... 714/786 |
| 6,415,398 | B1 | * | 7/2002 | Kikuchi et al. | ........... 714/755 |
| 6,973,610 | B1 |   | 12/2005 | Xu     |                |
| 2002/0194523 | A1 | * | 12/2002 | Ulrich et al. | ............ 714/4 |
| 2003/0126551 | A1 | * | 7/2003 | Mantha et al. | ........... 714/790 |

FOREIGN PATENT DOCUMENTS

| CA | 2322983 | 4/2001 |
| DE | 19736625 | 4/2001 |
| EP | 1093231 | 10/2000 |
| EP | 1158682 A2 | 11/2001 |
| EP | 1170898 | * 1/2002 |
| EP | 1229662 | 8/2002 |

(Continued)

OTHER PUBLICATIONS

Wilson S.G., "Digital Modulation and Coding," Prentice-Hall Inc., 1996, pp. 411-493.

(Continued)

*Primary Examiner*—Guy J Lamarre
(74) *Attorney, Agent, or Firm*—Larry J. Moskowitz

(57) ABSTRACT

Method and apparatus for generating codewords with variable length and redundancy from a single Low-Density Parity-Check (LDPC) code with variable length input words. A mother code for encoding data words is generated based on a parity-check matrix, wherein the mother code is adjusted to reflect the size of the data word to be encoded. A generator matrix applies the mother code to data words to produce codewords for transmission. In one embodiment, a reduction criteria is determined and the size of the generator matrix reduced in response. The corresponding parity-check matrix is applied at the receiver for decoding the received codeword.

8 Claims, 12 Drawing Sheets

FOREIGN PATENT DOCUMENTS

GB 2253974 A * 9/1992
WO 01/97387 12/2001

OTHER PUBLICATIONS

George Thomas, "A Rate-Adaptive Protocol For Wireless Data Channels," IEEE Wireless Communications and Networking Conference, Sep. 23, 2000, pp. 1345-1350.

R. Michael Tanner, "A Recursive Approach to Low Complexity Codes," IEEE Transactions on Information Theory, IEEE Inc., New York, Jan. 1962, pp. 533-547.

R.G. Gallager. *Low Density Parity Check Codes*. M.I.T. Press, first edition, 1963.

M. Fossorier et al. "Reduced Complexity Iterative Decoding of Low-Density Parity Check Codes Based on Belief Propagation," IEEE Trans. Communication, pp. 673-680, May 1999.

J. Chen and M. Fossorier, "Near Optimum Belief Propagation Based Decoding of Low-Density parity Check Codes," IEEE Trans. Communication, pp. 406-414, Mar. 2002.

Jing Li et al. "A Capacity-Approaching Type II Hybrid ARQ System Using Rate-Compatible Low Density Parity Check Codes" Department of Electrical Engineering, Texas A& M University, College Station, TX, pp. 1-5.

Joachim Hagenauer "Rate-Compatible Punctured Convolutional Codes (RCPC Codes) and their Applications," IEEE Transactions on Communications, vol. 36, No. 4, Apr. 1998, pp. 389-400.

International Search Report, PCT/US03/036230 - International Search Authority - EPO - Apr. 26, 2004.

International Preliminary Examination Report - PCT/US03/036230 - IPEA/US - Dec. 12, 2004.

Kou et al., "Low-Density parity-check codes based on finite geometries: A rediscovery and new results," IEEE Transactions on Information Theory, vol. 47, No. 7, Nov. 2001, pp. 2711-2736.

* cited by examiner

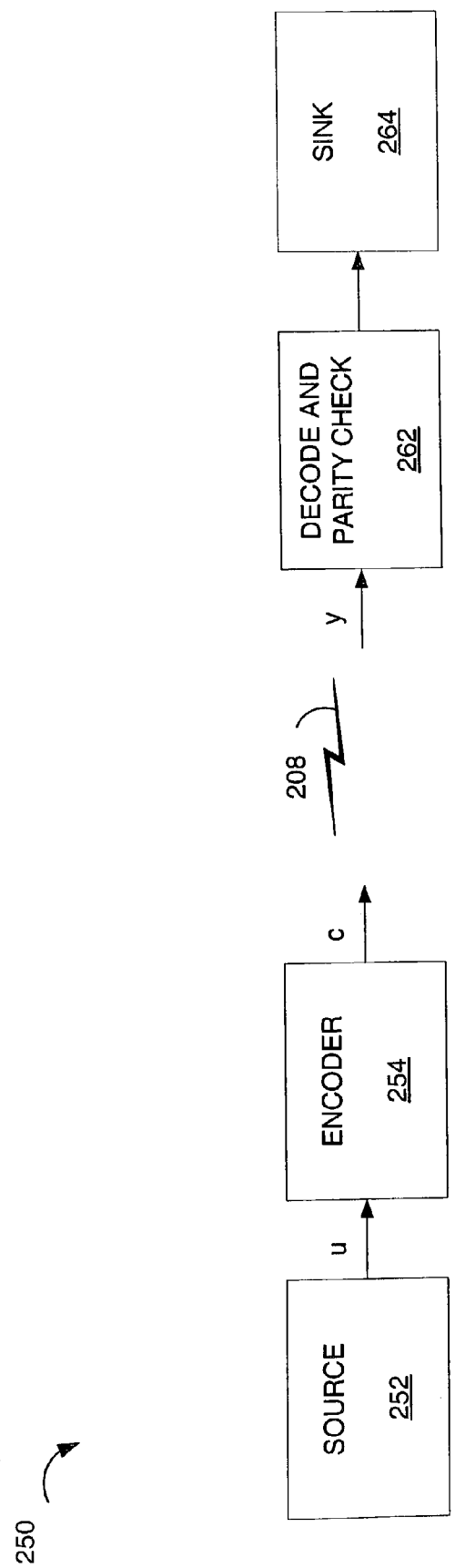

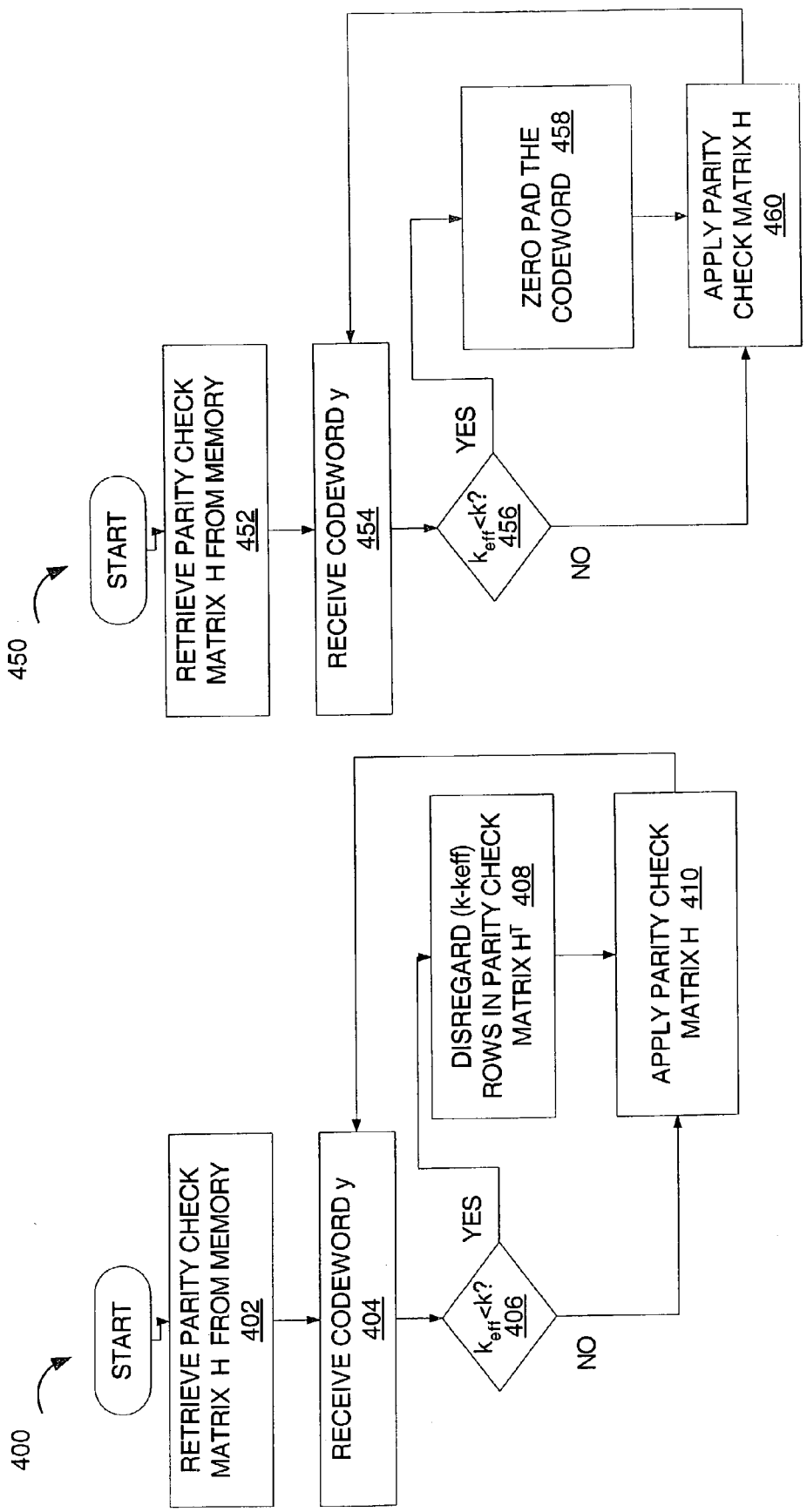

RATE-COMPATIBLE LDPC CODES

BACKGROUND

1. Field

The present invention relates generally to communications, and more specifically, to rate-compatible error-correcting coding using Low Density Parity-Check (LDPC) codes.

2. Background

In communication systems that employ rate adaptation, for example, wherein the transmission data rate is adjusted according to conditions and demands of the system, there is a need to transmit data so as to flexibly and efficiently adapt the data rate to the current channel conditions. Typical error correcting designs, for example, select a fixed code, the code having a certain rate and correction capability. To add flexibility for handling different amounts of data having different error protection requirements, adjusting to time-varying channel conditions, as well as compensating for insufficiently known parameters, flexible channel encoding may be employed.

For flexible channel encoding, the data bits may be grouped into blocks of varying size, and these blocks may be encoded with different amounts of redundancy, resulting in codewords of different lengths. Instead of using several separate error correcting codes to encode the different groups of bits, it is desirable to use a single mother code that may accommodate several rates. This is referred to as rate-compatible coding. Using a single code instead of separate codes for each desired rate may significantly reduce the complexity of both encoding at the transmitter and decoding at the receiver, however, the reduced complexity is achieved at the expense of some performance degradation. One such method for rate-compatible coding involves Rate-Compatible Punctured Convolutional (RCPC) codes. This and other current methods offer limited performance or incur undesirable computational complexity at the decoder.

There is a need therefore, to provide high performance rate-compatible coding schemes that support rate adaptation while minimizing the complexity of the encoder and the decoder.

BRIEF DESCRIPTION OF THE DRAWINGS

FIG. 7 illustrates a wireless communication system employing rate-compatible coding.

FIGS. 9A and 9B are flow diagrams illustrating adaptive decoding at the receiver.

DETAILED DESCRIPTION

An error correction coding system is typically designed to satisfy a protection requirement for data transmissions. A fixed code with a given code rate is selected. The correction capability is matched to the protection requirement and adapted to the average or worst case channel conditions to be expected. For rate adaptation, the coding system should be flexible as data for transmission may have a variety of different error protection needs. Additionally, adaptation requires responding to the time-varying channel conditions.

Figure 1:
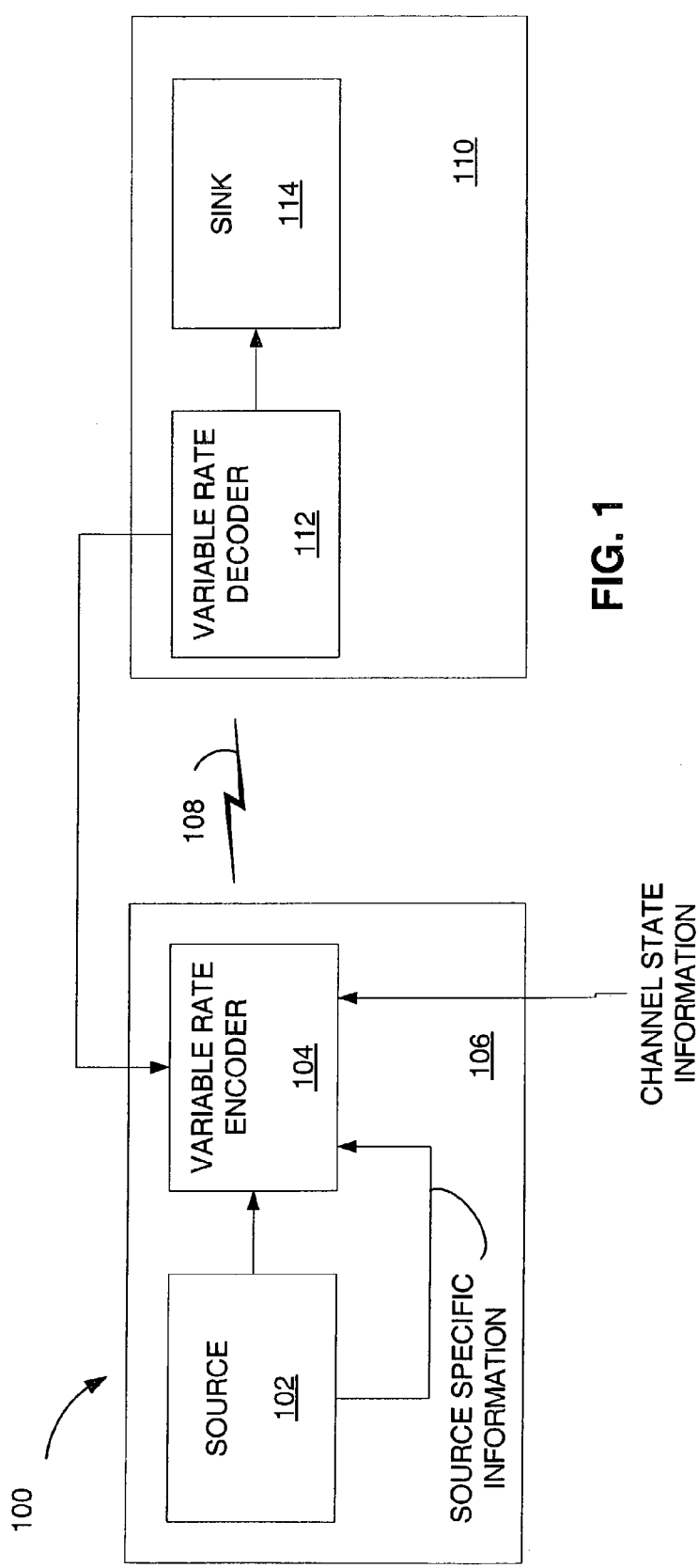
FIG. 1 is a diagram of a coded transmission scheme in a communication system.

FIG. 1 illustrates a wireless communication system 100 having a transmitter 106 and receiver 110. Each of the transmitter 106 and receiver 110 may be a transceiver capable of transmission and receipt of data communications. For simplicity only those functional modules used in the following description are illustrated in system 100 of FIG. 1. The transmitter 106 includes a transmission source 102 and a variable-rate encoder 104. The transmitter 106 and receiver 110 communicate via a channel 108. The receiver includes a variable-rate decoder 112 and an information sink 114. The information to be transmitted from the source 102 may include Source Specific Information (SSI) indicating the protection requirements of the data, such as control and signaling information corresponding to a data stream. The source 102 provides the SSI (if any) to the encoder 104. The encoder 104 applies the SSI to rate adaptation, wherein, the transmission rate is adjusted in response thereto. The encoder 104 further receives Channel State Information (CSI) that provides information as to the changing characteristics and quality of the channel 108. The transmitter 106 may use CSI to determine the coding used for a transmission. The encoder 104 applies variable codes adapted to the source 102 and channel 108.

It is desirable to incorporate one encoder structure that may be modified for rate adaptation and avoid switching between different encoders for each rate combination. One method for providing a single encoder structure punctures a convolutional code, wherein certain code bits are not transmitted. Such codes are referred to as Rate-Compatible Punctured Convolutional (RCPC) codes. Note that convolutional codes are just one example of rate-compatible codes, alternate embodiments may incorporate other rate-compatible codes such as punctured block codes, punctured turbo codes, etc.

The punctured convolutional codes satisfy a rate-compatibility restriction, wherein high rate codes are embedded in lower rate codes. While RCPC coding facilitates the use of a single encoder structure there is a degradation in performance.

According to one embodiment, the encoder 104 applies a method for generating codewords with variable length and redundancy from a single Low-Density Parity-Check (LDPC) code with variable length input words. An LDPC code is a block code specified by a parity-check matrix, which contains mostly zeroes and only a few numbers of ones.

The communication system 100 considered may have short to moderate block lengths. LDPC codes have demonstrated impressive performance, significantly better than convolutional codes and comparable to turbo codes. Note that both turbo codes and LDPC codes incur considerable decoding complexity, but LDPC codes have the potential to be decoded much more efficiently, and therefore faster than turbo codes. In systems with very high data rates, such as future Wireless Local Area Networks (WLANs) or Wireless Personal Area Networks (WPANs) with data rates of 100 Mbits/s and higher, a turbo decoder introduces a serious bottleneck to processing at the receiver 110. LDPC codes provide an alternative for satisfying stringent requirements in terms of bit error rate and decoding speed.

There are two types of LDPC codes: regular and irregular. The definitions for irregular and regular LDPC codes are provided hereinbelow. It has been reported that irregular LDPC codes outperform both regular LDPC codes and turbo codes for very long block lengths. However, for short to moderate block lengths, the performance improvement over the latter two codes is marginal. Regular codes, on the other hand, may be designed to have very large minimum distance $d_{min}$ (discussed hereinbelow), which may not be the case with an irregular code. Note that regular codes designed to have very large minimum distances $d_{min}$ have good error detection capability. Additionally, the structure of regular codes supports efficient parallel decoder implementation, and therefore, very high decoding speeds can be achieved. The following discussion considers regular LDPC codes specifically, however, alternate embodiments may apply irregular LDPC codes.

An LDPC code is a linear error-correcting block code. The LDPC code is specified by a sparse "parity-check" matrix H of size (n−k)×n rows by columns, where k is the size of the input block and n is the size of the output block (codeword). The parity-check matrix H is characterized by its low density meaning a small number of nonzero elements. The code rate is given by $$R = \frac{k}{n}.$$

A regular LDPC code contains t 1's per column s 1's per row, wherein s is given as:

$$s=t\cdot(n|n-k), \quad (1)$$

wherein t<<(n−k), and therefore, s>t. The (n−k) rows of H are referred to as parity checks and the elements of the LDPC codeword are referred to as bits. The matrix H may be represented as a bipartite graph known as the probability dependency graph or the Tanner graph with one subset of nodes representing all the bits and the other subset of nodes representing all the parity checks. As a simplistic but illustrative example, consider a 4×8 parity-check matrix given as:

$$H = \begin{bmatrix} 1 & 1 & 1 & 0 & 0 & 0 & 0 & 0 \\ 0 & 0 & 0 & 1 & 1 & 1 & 0 & 0 \\ 1 & 0 & 0 & 1 & 0 & 0 & 1 & 0 \\ 0 & 1 & 0 & 0 & 1 & 0 & 0 & 1 \end{bmatrix} \quad (1a)$$

Figure 2:
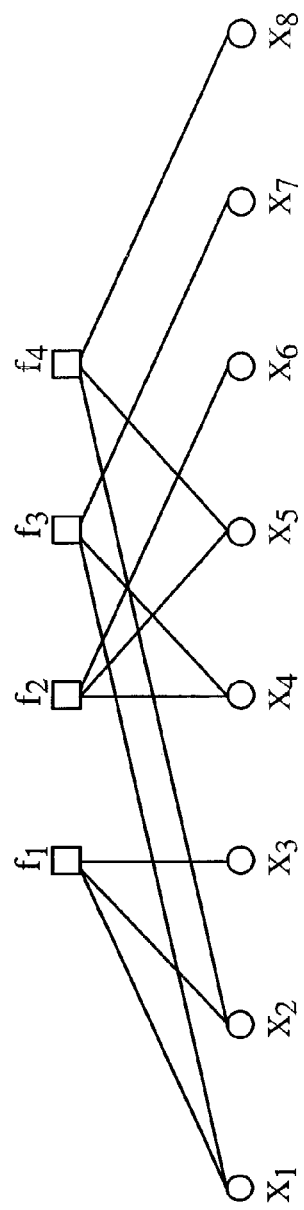
FIG. 2 is a Tanner graph representation of a parity check matrix H.

The Tanner graph representation of H consists of n=8 bit nodes and n−k=4 check nodes, as illustrated in FIG. 2. The bit nodes are identified as the circular nodes labeled $X_1$, $X_2$, ..., $X_8$ and correspond to the 8 coded bits of a codeword generated with this code. The check nodes are identified as the square nodes labeled $f_1$, $f_2$, $f_3$, $f_4$ and correspond to the 4 parity checks performed by H.

Decoding of LDPC codes is commonly performed using a method referred to as the "message-passing" algorithm. This algorithm operates on the Tanner graph representation of the parity-check matrix, and computes "soft" bit decisions comprising sign and reliability information for the coded bits as well as soft information about the parity checks. Messages containing soft bit decisions and messages containing soft parity-check information are then exchanged in an iterative manner between the bit nodes and the check nodes until a predetermined stopping criterion is reached. Final "hard" bit decisions can then be made.

Note that in contrast to a regular LDPC code, an irregular LDPC code has a non-uniform distribution of 1's in its rows and columns. In either case, the parity-check matrix has a low density of 1's. The parity-check matrix may be constructed by appending weight-t column vectors generated at random such that the resulting row weight is s. In order to reduce the probability of low-weight codewords, constrain $t \geq 3$ and limit any two columns in H to only one occurrence of overlapping non-zero bits. In other words, when arbitrarily selecting two columns in the matrix H, the 1's in the two columns should not occur in the same position more than once. Else, cycles in the corresponding Tanner graph will occur, which may cause the decoding performance to deteriorate. The probability of finding a "good" code, i.e., a code that has a large $d_{min}$, with such semi-random construction, is very close to one for large n. The minimum distance of a code, $d_{min}$, refers to the minimum number of bit errors that can occur if the decoder makes a wrong decision. The codeword with the minimum distance from the correct codeword is the most likely wrong decision the decoder will make, as that decision is the nearest one to the correct one. Other wrong decisions may occur from time to time, but it is the one with the minimum distance that usually dominates the performance. The minimum distance is determined by the structure of an individual code. In addition to the method mentioned above, there are a variety of other methods for generating parity-check matrices with the desired properties.

According to one embodiment, once the parity-check matrix has been constructed, the matrix H is put in the form:

$$H=[P\ I_{n-k}] \quad (2)$$

via Gauss-Jordan elimination and, possibly, column swapping. The matrix $I_{n-k}$ is the identity matrix of size (n−k)×(n−k). The matrix P has size (n−k)×k. The corresponding code generator matrix G is given as:

$$G=[I_k\ P^T] \quad (3)$$

satisfying the property:

$$G \cdot H^T = 0. \quad (4)$$

Having the generator matrix in this form yields a systematic code, which is beneficial in one embodiment. The mapping (encoding) of a data word u into the codeword c is performed according to the equation:

$$c = u \cdot G, \quad (5)$$

wherein u and c are both row vectors, wherein the generator matrix G is used at the transmitter. The parity-check matrix is used at the receiver to perform up to (n−k) separate parity checks on the received codeword y. The received codeword is given as:

$$y = c + e, \quad (6)$$

wherein e denotes an error word. A check is performed at the receiver to verify that:

$$y \cdot H^T = 0, \quad (7)$$

implying that the error word is e=[0 0 ... 0], i.e., the received and decoded codeword contains no errors. If (7) is not satisfied, the decoded codeword contains errors.

The transposed parity-check matrix $H^T$ is given as $$H^T = \begin{bmatrix} P^T \\ \dots \\ I_{n-k} \end{bmatrix} \quad (8)$$

The process of encoding using the generator matrix G and the process of decoding and then verifying the received codewords or samples using the parity check matrix H are illustrated in FIG. 7. The system 250 includes an information source 252 which provides data to encoder 204. The actual code (i.e., matrices H and G) may be generated off-line and is not necessarily part of the encoding/decoding performed by the system during operation. The encoder 204 encodes the data and transmits the encoded data to a receiver via a transmission link 208. Decoding and parity checking are performed at unit 262, and the results provided to a sink 264 for use at the receiver.

Figure 3:
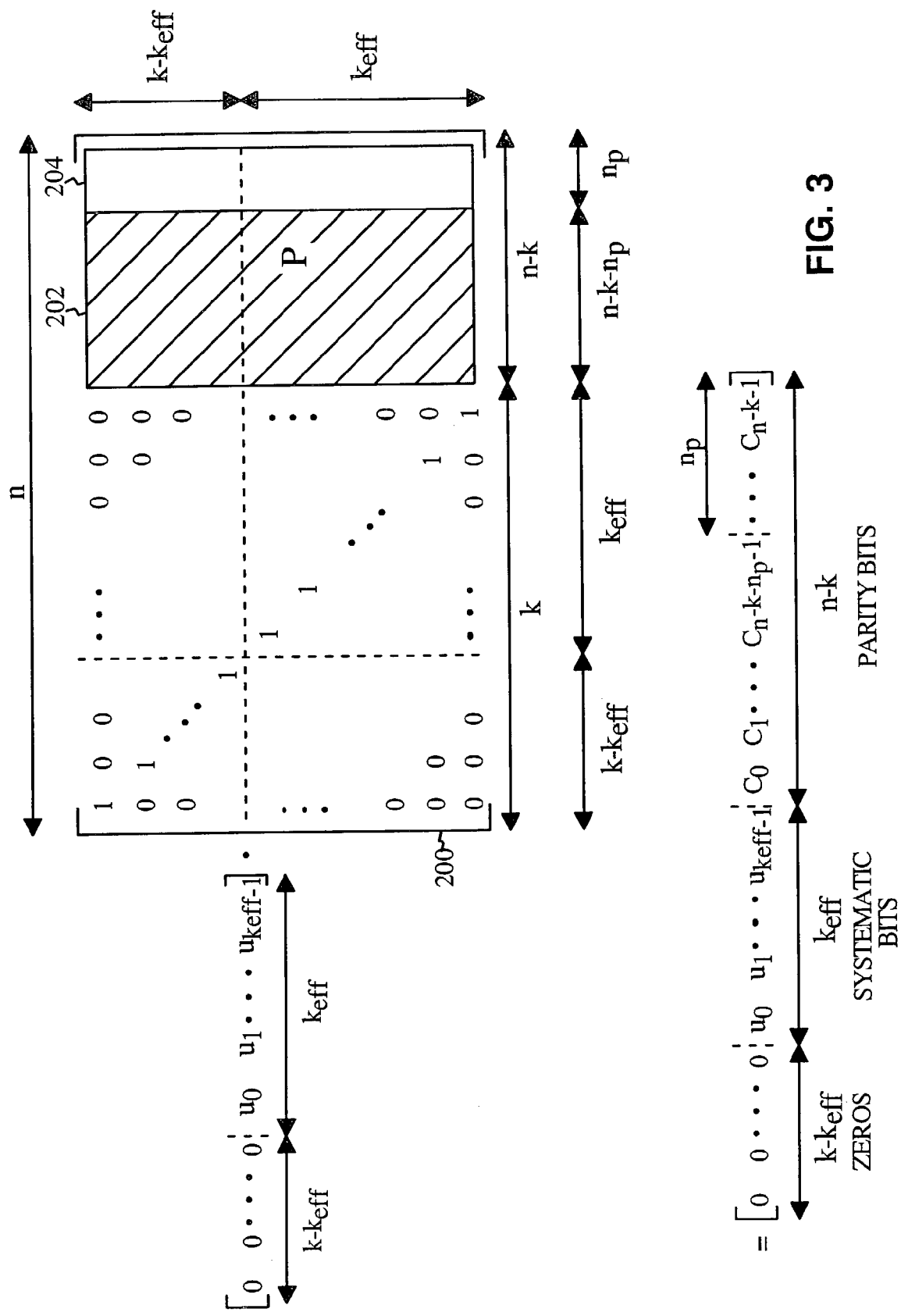
FIG. 3 illustrates encoding of a data word u, by a generator matrix G to form a codeword c.

Using the (n,k) mother code, the generator matrix G may be used to encode data words that are shorter than k into codewords with varying code rates to accommodate a range of desired data rates. First, consider the encoding of a short data word of length $k_{eff}$ wherein $k_{eff}$<k. FIG. 3 illustrates generation of the codeword c from the input data word u. In this example, u includes k elements: 1) $k_{eff}$ data elements, represented as $u_0, u_1, \dots, u_{k_{eff}-1}$; and 2) $(k-k_{eff})$ zeroes. The generator G is then applied to the input data word u. The resulting codeword consists of $(k-k_{eff})$ zeros, $k_{eff}$ systematic bits (which are simply the original data bits), and (n–k) parity bits. The zeros may be discarded prior to transmission if desired, yielding a codeword of length $n_{eff}$, given as:

$$n_{eff} = n - k + k_{eff} \quad (9)$$

with the new code rate given as:

$$R' = k_{eff}/n_{eff} \quad (10)$$

Figure 4:
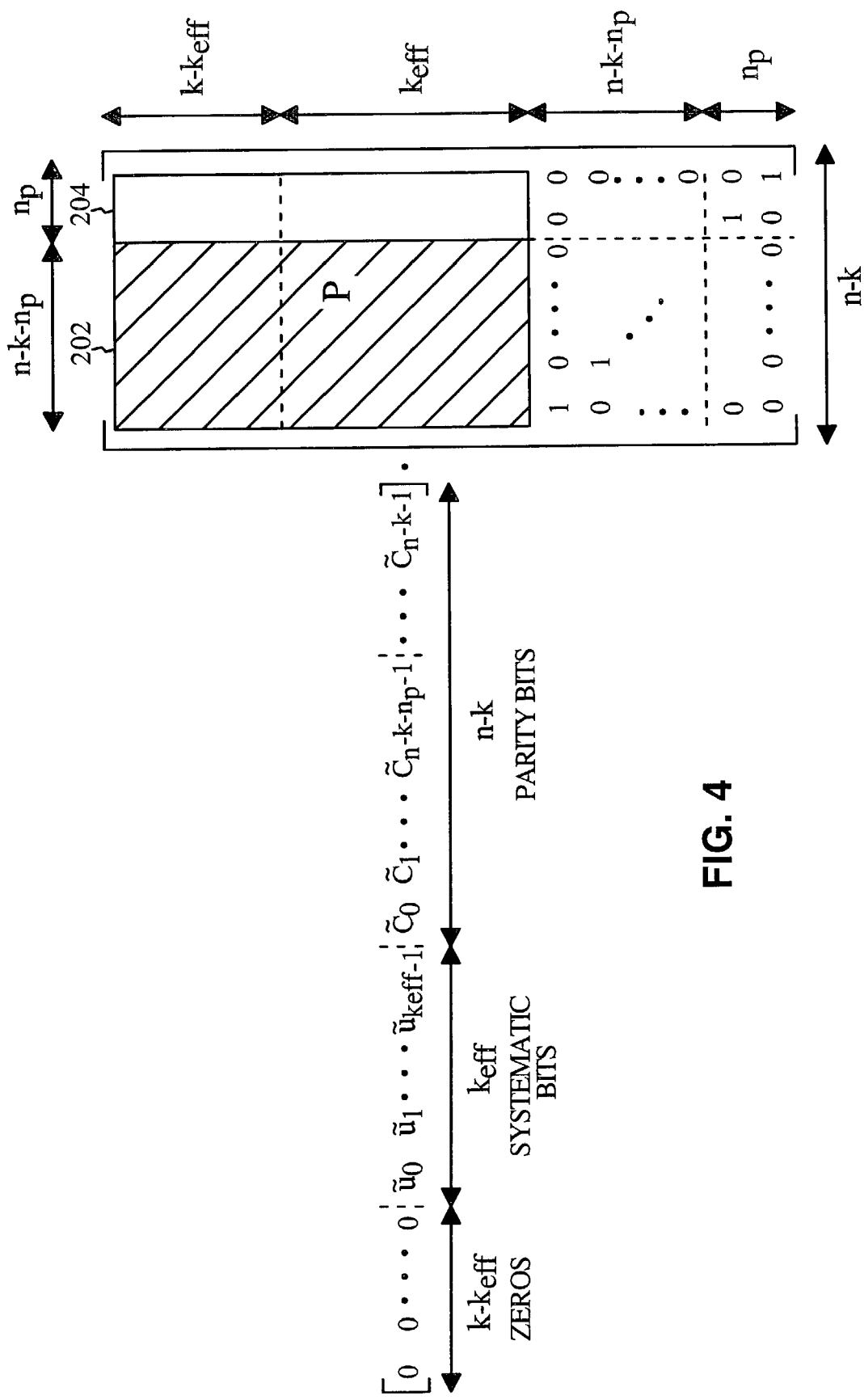
FIG. 4 illustrates parity check of a received codeword y by applying the parity check matrix H.

The zero-padding is equivalent to deleting the top $(k-k_{eff})$ rows of G (or $P^T$). In practice, the encoding of a data word of length $k_{eff}$ may not involve zero-padding. Rather, it may simply involve multiplying the $k_{eff}$ data bits by the matrix $P^T$ (minus its top $(k-k_{eff})$ rows) and the final codeword would consist only of the resulting (n–k) parity bits appended to the $k_{eff}$ systematic bits. At the receiver, the parity-check matrix $H^T$ (with the corresponding $(k-k_{eff})$ uppermost rows deleted) performs (n–k) separate parity checks, as shown in FIG. 4. The zeroes are reinstated in FIG. 4 to illustrate that the received shortened codeword is a subset of the maximum-length codeword. Specifically, FIG. 4 illustrates the received codeword with the $(k-k_{eff})$ zeros reinstated, as well as the $k_{eff}$ systematic bits; and the (n–k) parity bits, but in practice, the parity checks performed at the receiver may only involve the $(n-k+k_{eff})$ systematic and parity bits as well as $H^T$ (minus its $(k-k_{eff})$ uppermost rows). The receiver verifies the received codeword y when the result of $y \cdot H^T$ satisfies Equ. (7) given hereinabove.

Figures 8A, 8B:
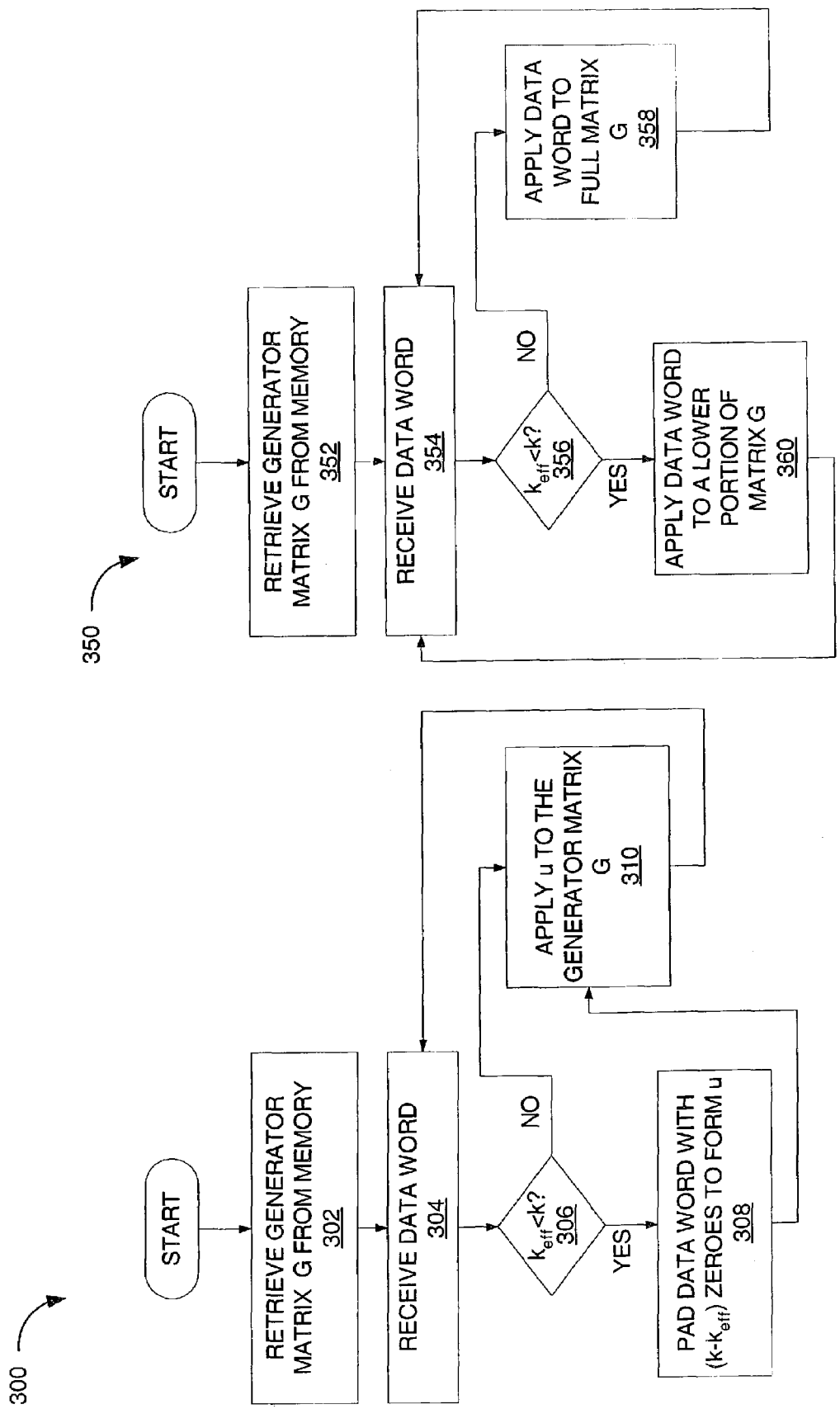
FIGS. 8A and 8B are flow diagrams illustrating rate-compatible encoding at the transmitter.

FIG. 8A illustrates operation at the transmitter, wherein the process 300 for preparing a data word for transmission first retrieves the appropriate generator matrix from memory at step 302. When a data word is received at step 304 the process determines the size of the data word. If the data word has a size $k_{eff}$ less than k, zeroes (step 306) are added to pad the data word to generate u at step 308. The padded data word u is then applied to the generator matrix G.

FIG. 8B illustrates alternate processing 350 at the transmitter wherein the generator matrix G is retrieved from memory at step 352. When a data word is received at step 354 the process determines the size of the data word. If the data word has a size $k_{eff}$ less than k (step 356) then processing continues to step 360 to apply the data word to a portion, such as the lower portion, of the generator matrix G. In this case, the data word is not padded with zeroes. Else, the processing continues to step 358 to apply the data word to the full generator matrix G.

At the receiver, as illustrated in FIG. 9A, a process 400 begins by retrieving a parity-check matrix H from memory at step 402. The parity-check matrix H corresponds to the generator matrix G of FIG. 8A. A codeword y is received at step 404, and the size of the codeword determined. If the length of the received codeword y is less than n (step 406) $(k-k_{eff})$ rows of the parity check matrix H are disregarded at step 408. The codeword y is then applied to the parity-check matrix H (minus $(k-k_{eff})$ rows) at step 410.

FIG. 9B illustrates alternate processing 450 at the receiver wherein the parity-check matrix H is retrieved from memory at step 452. A codeword y is received at step 454, and the size of the codeword determined. If the length of the received codeword y is less than n (step 456) the codeword is padded with $(k-k_{eff})$ zeroes at step 458 to result in a length n. Else processing continues to step 460 to apply the full parity-check matrix H.

Additionally, consider the encoding of a full-length data word, i.e., length k, into a codeword with fewer than (n–k) parity bits. To reduce the number of parity bits by $n_p$, the last $n_p$ parity bits may be punctured after encoding, or it is possible to omit the computation of the last $n_p$ parity bits entirely, which is equivalent to deleting the $n_p$ rightmost columns of G (or PT) The columns to be deleted are represented in FIG. 3 as a lightly shaded rectangle 204. In this case, the resulting code rate is given as:

$$R' = k/(n-n_p). \quad (11)$$

At the receiver, the corresponding parity-check matrix consists of only the $(n-k-n_p)$ leftmost columns of the original HT matrix, as illustrated in FIG. 4, wherein the retained columns are represented by a dark grey shaded rectangle 202. Alternatively, the decoder may treat the "missing" parity bits as erasures and insert zeros in their place prior to performing all the (n–k) parity checks.

When using a parity-check matrix made up of a subset of the columns of $H^T$ to obtain higher rate codewords as described hereinabove, it is desirable that the properties of the full-size parity-check matrix carry over to the smaller matrix. In particular, the smallest size parity-check matrix must satisfy the constraint that $t \geq 3$.

Figure 5:
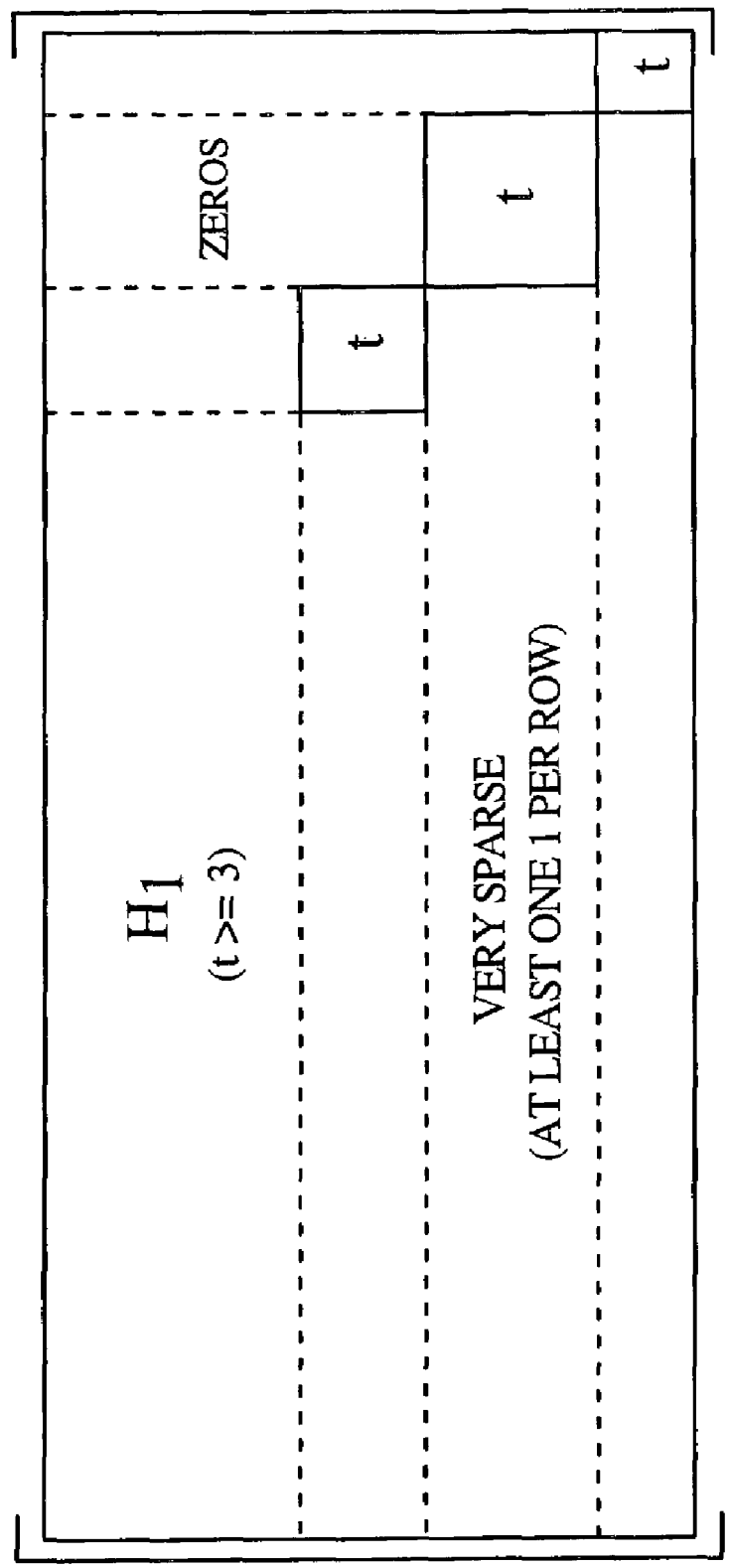
FIG. 5 illustrates a rate-compatible parity-check matrix H.
Figure 6:
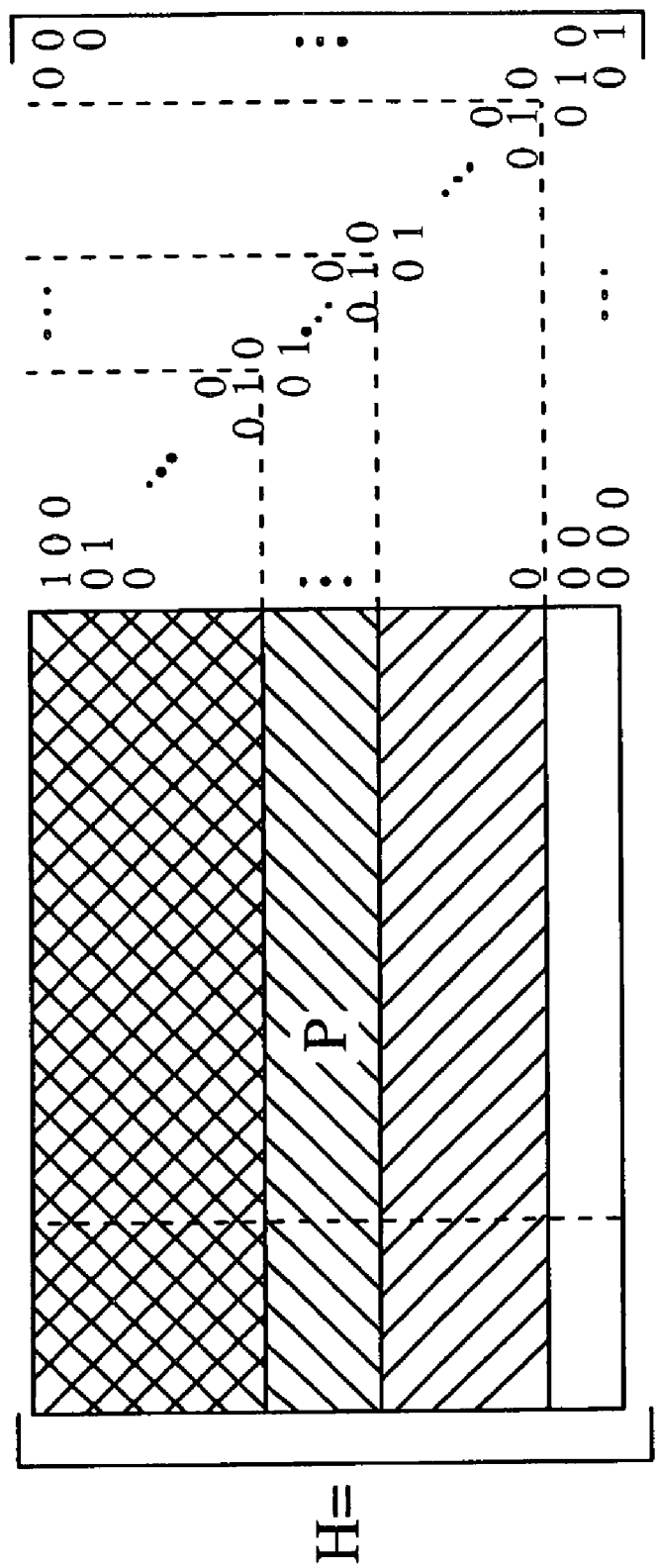
FIG. 6 illustrates a rate-compatible parity-check matrix H in systematic form.

As an example, consider a mother code capable of generating codewords with four different rates. The parity-check matrix of the mother code is illustrated in FIG. 5. The smallest size parity-check matrix is labeled as $H_1$, and has column weight %, i.e., it has t 1's per column. Additional matrices may be formed therefrom by extension at the bottom right corner. The second smallest matrix, referred to as $H_2$, consists of $H_1$ extended by a square matrix at the bottom right corner whose columns all have weight %, a matrix of all-zeros on the right hand side and a very sparse matrix to the bottom. In the sparse submatrix, each row has at least one 1 to ensure sufficient dependencies between the coded bits of the smaller and the extended matrices, but otherwise is left very sparse to simplify both code construction and decoding. The resulting parity-check matrix, $H_2$, has a column weight of at least t. Hence, it is no longer a regular parity-check matrix albeit a nearly regular one. The larger matrices, referred to as $H_3$ and $H_4$, respectively, are constructed in the same manner. After the full-size matrix has been constructed, it is put into systematic form using Gauss-Jordan elimination, as described previously. The resulting matrix H is illustrated in FIG. 6.

Figure 10:
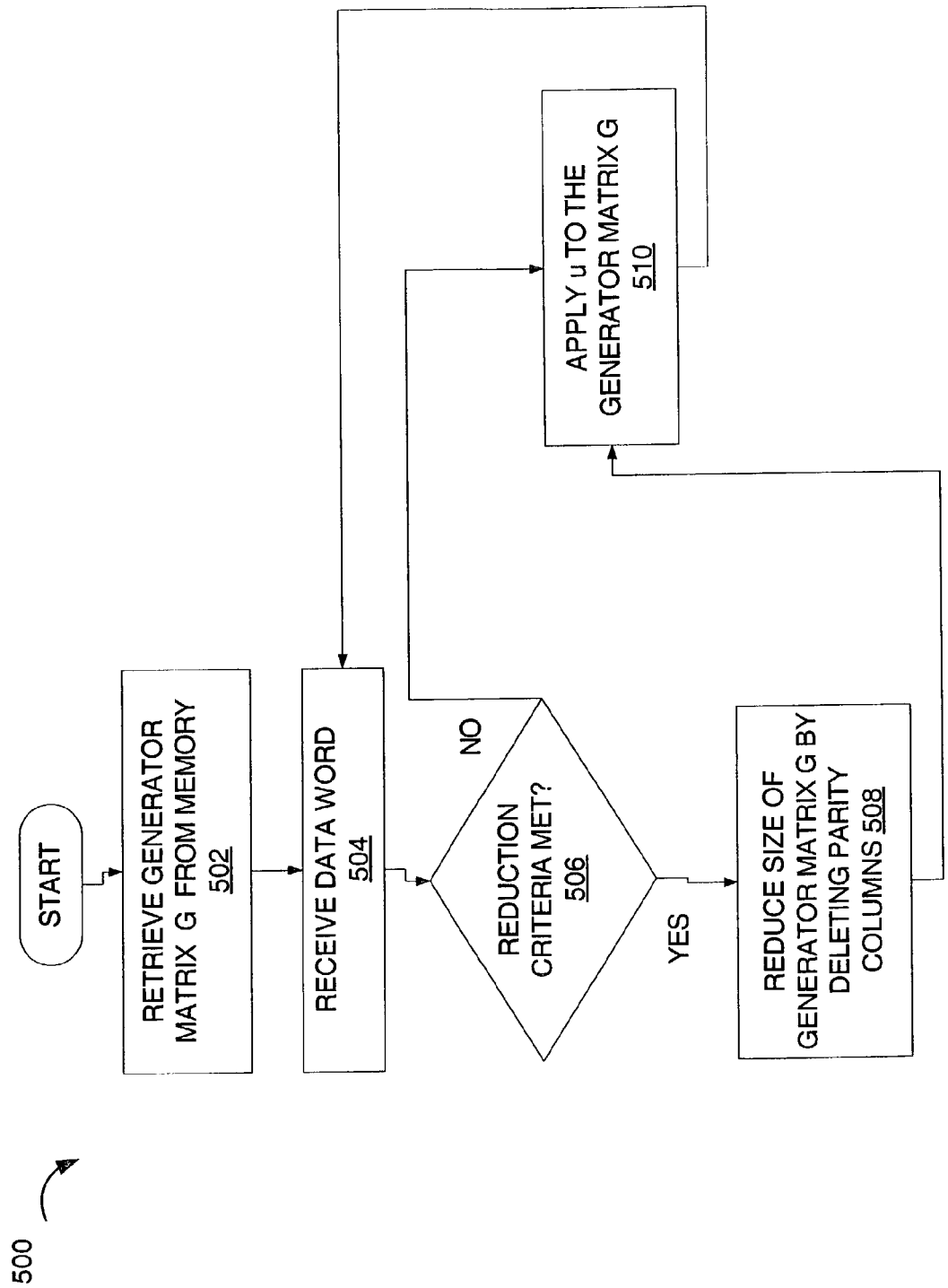
FIG. 10 is a flow diagram illustrating encoding of data words incorporating generator matrix reduction.

FIG. 10 illustrates a method for encoding a data word using fewer than (n–k) parity bits. The process 500 begins by retrieving a generator matrix G at step 502. A data word is received at step 504. In this case, a criterion is determined, such as the channel condition measured above a threshold, at step 506. For a good channel condition there is a desire to transmit less than the full amount of parity bits. When the channel condition is good, the size of the generator matrix G is reduced at step 508 by deleting a portion of the parity columns. The data word u is then applied to the generator matrix G.

Figure 11:
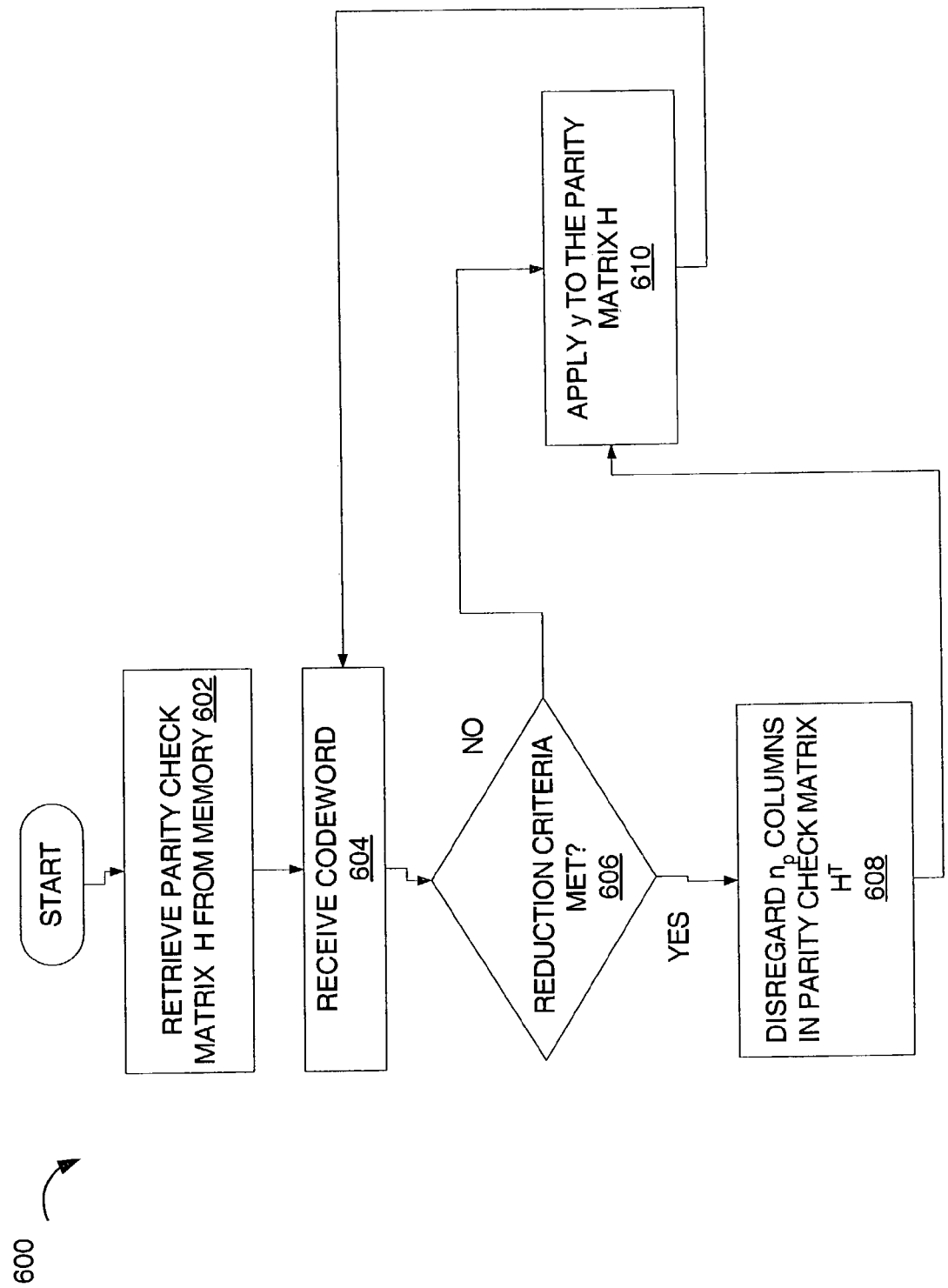
FIG. 11 is a flow diagram illustrating decoding of code words incorporating parity-check matrix reduction.

FIG. 11 illustrates a corresponding process 600 for decoding a received transmission supporting the reduction of the size of a parity-check matrix wherein a parity-check matrix H is retrieved from memory in step 602. A codeword is received at step 604. If a reduction criterion is met at decision diamond 606, the process continues to step 608 to reduce the size of the parity check matrix by disregarding $n_p$ of its columns. Else, processing continues to step 610 to apply the received message y to the full-size parity-check matrix H. Note that after reduction of the parity-check matrix H at step 608, the processing also proceeds to step 610.

Combinations of the two cases discussed above are also possible, i.e., wherein the input data word has length $k_{eff} < k$ and only (n–k–$n_p$) parity bits are generated. In this case, only the top (n–k–$n_p$) rows of H corresponding to either $H_1$, $H_2$ or $H_3$ would be used and the (k–$k_{eff}$) leftmost columns of H (or, equivalently, the top (k–$k_{eff}$) rows of $H^T$) would be deleted, as indicated by the dotted vertical line in FIG. 6. Deleting these columns does not significantly alter the properties of the overall parity-check matrix.

Figure 12:
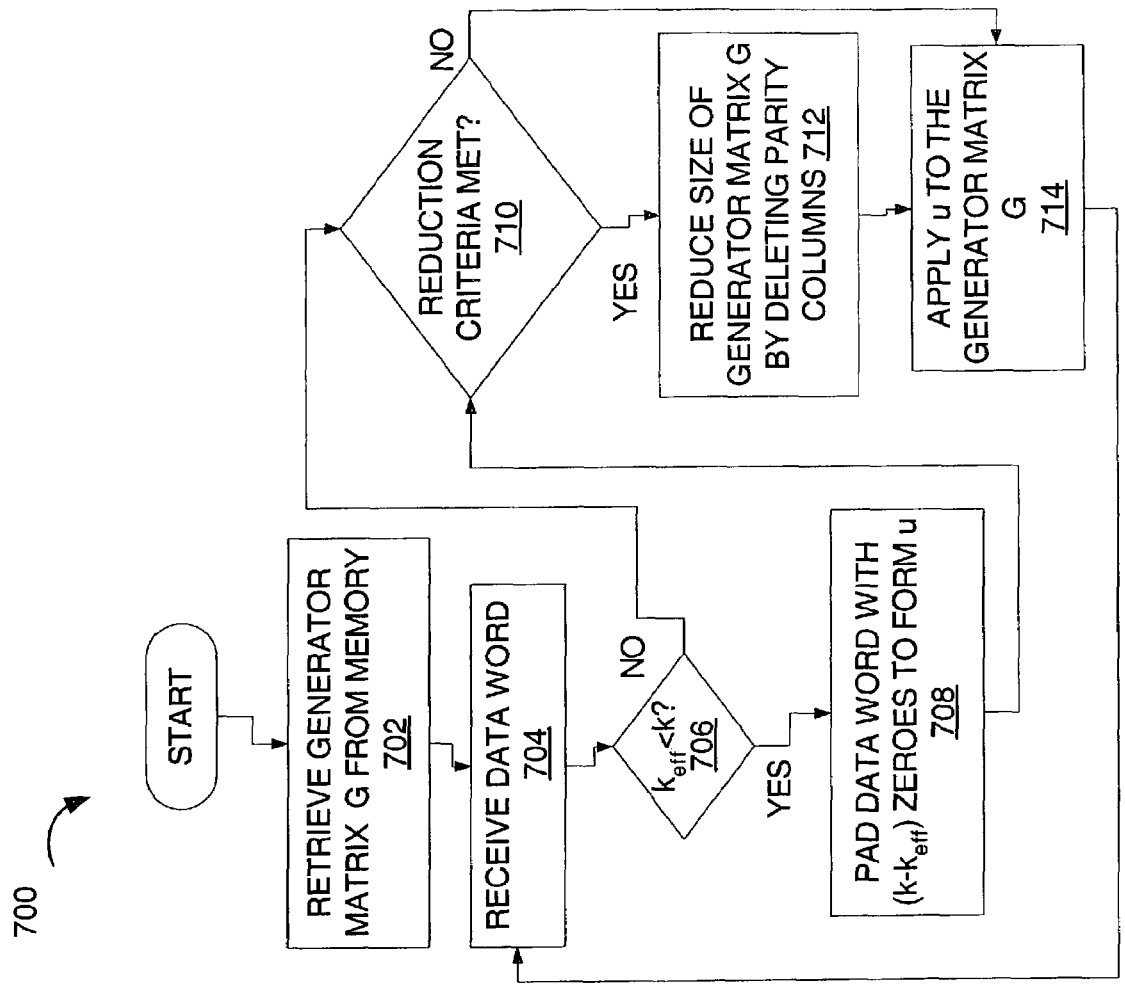
FIG. 12 is a flow diagram illustrating an encoding process of rate-compatible coding incorporating generator matrix reduction.

FIG. 12 illustrates an encoding embodiment that combines a process as in FIG. 8A with the process as in FIG. 10. As illustrated, if the length of the data word is less than the input block length (706), the data word is padded with zeroes at step 708. The process then evaluates a reduction criterion at step 710. The reduction criteria may be a channel quality criteria, such as C/I threshold(s), etc. Alternate embodiments may use other criteria that affect the operation and/or performance of a given system. The size of the generator matrix is then reduced (712) if the reduction criterion is satisfied.

Figure 13:
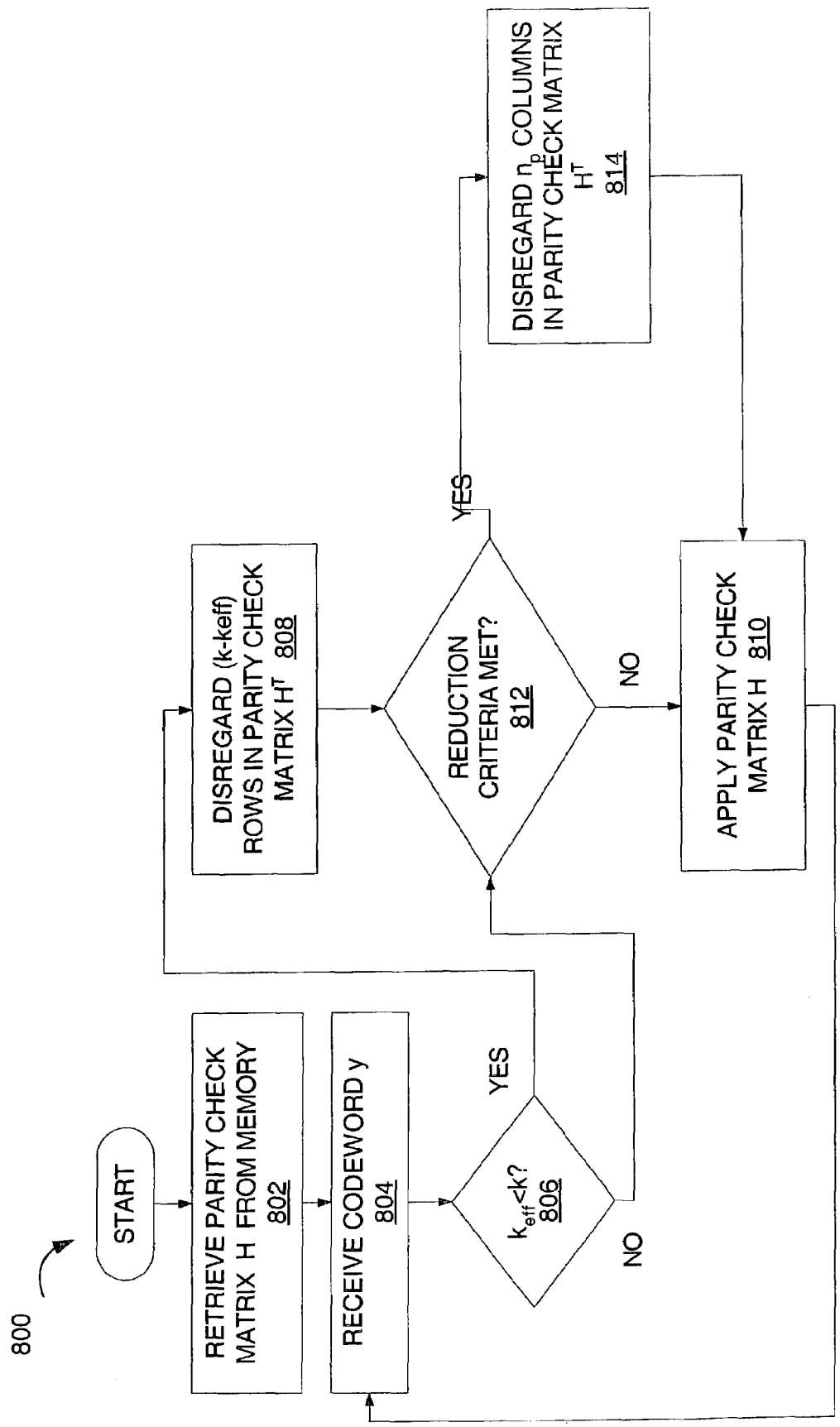
FIG. 13 is a flow diagram illustrating a decoding process of rate-compatible coding incorporating parity-check matrix reduction.

FIG. 13 illustrates a decoding embodiment that combines a process as in FIG. 9A with a process as in FIG. 11. As illustrated, if the length of the data word is less than the input block length (806) rows in the parity check matrix are disregarded at step 808, and the process then evaluates a reduction criteria at step 812. The reduction criteria may be a channel quality criteria, such as C/I threshold(s), etc. Alternate embodiments may use other criteria that affect the operation and/or performance of a given system. The size of the parity-check matrix is then reduced (814) if the reduction criterion is satisfied.

As mentioned earlier, LDPC codes may, in general, be decoded using a method referred to as the message-passing algorithm, which aims to find the most probable codeword such that Equ. (7) is satisfied, and operates on the graphical representation of the parity-check matrix known as the Tanner graph. The graph consists of n bit nodes, which represent the coded bits, and (n–k) check nodes, which represent the (n–k) parity checks specified by the parity-check matrix. The algorithm passes probability messages about the coded bits back and forth between the bit nodes and the check nodes in an iterative manner until all (n–k) parity checks are satisfied, thus forming the basis for soft decisions that consist of sign and reliability information for each of the coded bits. The soft decisions may be conveniently expressed in the form of Log Likelihood Ratios (LLRs) in the same way as is known from turbo coding. The optimal version of the message-passing algorithm is known as the sum-product algorithm, and both this and a low-complexity approximation known as the min-sum algorithm, as well as any other algorithm based on message-passing, may, in general, be used to decode the rate-compatible LDPC codes such as the embodiments described hereinabove.

The transmitter provides the receiver with information regarding the proper use of the parity-check matrix prior to the decoding process. The transmitter and receiver may negotiate to establish the structure of the matrices used at the transmitter and receiver for encoding and decoding, respectively. Note that the proper use, e.g. which rows and columns are to be disregarded, etc., of the G and H matrices may be negotiated. Additionally, there may be difficulties in covering all possible operating conditions with one single mother code; therefore a system may have a set of mother codes to choose from, each of which can accommodate a unique set of code rates. This allows for a finer granularity of available code rates and data rates. Alternatively, the matrix formats may be predetermined based on operating conditions or assumptions, such as link quality, or other metric.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal or communication system infrastructure element, including, but not limited to, a central switching office, a wired/wireless access point, a base station, etc. In the alternative, the processor and the storage medium may reside as discrete components in a user terminal or communication system infrastructure element, including, but not limited to, a central switching office, a wired/wireless access point, a base station, etc.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for encoding transmissions in a communication system, comprising:
   selecting a first code having a bit length, wherein the first code is determined by a variable rate encoder that is responsive to data protection requirements and channel characteristics and is selected by:
   selecting a low-density parity-check matrix; and
   selecting a generator matrix based on the low-density parity check matrix;
   receiving a data word for transmission;
   padding the data word with zeroes as necessary to extend the data word to the bit length; and
   encoding the padded data word using the first code to generate a codeword.

2. The method as in claim 1, further comprising:
   discarding zeroes from the codeword to form a shortened codeword; and
   transmitting the shortened codeword.

3. An apparatus for encoding transmissions in a communication system, comprising:
   means for selecting a first code having a bit length, wherein said means for selecting a first code further comprises:
   means for selecting a low-density parity-check matrix;
   selecting a generator matrix based on the low-density parity-check matrix; and
   means for receiving a data word for transmission;
   means for padding the data word with zeroes as necessary to extend the data word to the bit length; and
   means for encoding the padded data word using the first code to generate a codeword.

4. The apparatus as in claim 3, further comprising:
   means for discarding zeroes from the codeword to form a shortened codeword; and
   means for transmitting the shortened codeword.

5. A computer-readable medium having stored thereon computer-executable instructions for:
   selecting a low-density parity-check matrix; and
   selecting a generator matrix based on the low-density parity check matrix;
   generating a first code having a bit length using the generator matrix;
   receiving a data word for transmission;
   padding the data word with zeroes as necessary to extend the data word to the bit length; and
   encoding the padded data word using the first code to generate a codeword.

6. The computer-readable medium as in claim 5, further having stored thereon computer-executable instructions for:
   discarding zeroes from the codeword to form a shortened codeword; and
   transmitting the shortened codeword.

7. An apparatus for encoding transmissions in a communication system, comprising:
   a processor, wherein the processor is configured to perform steps comprising:
   selecting a low-density parity-check matrix; and
   selecting a generator matrix based on the low-density parity check matrix;
   generating a first code having a bit length using the generator matrix;
   receiving a data word for transmission;
   padding the data word with zeros as necessary to extend the data word to the bit length; and
   encoding the padded data word using the first code to generate a codeword.

8. The apparatus as in claim 7, wherein the processor is configured to perform steps further comprising:
   discard zeroes from the codeword to form a shortened codeword; and
   transmit the shortened codeword.

* * * * *